United States Patent [19]

Kirayoglu et al.

[11] Patent Number: 5,314,742
[45] Date of Patent: May 24, 1994

[54] RESIN IMPREGNATED LAMINATE FOR WIRING BOARD APPLICATIONS

[75] Inventors: Birol Kirayoglu, Wilmington, Del.; William J. Sillivan, Richmond, Va.; Melvin P. Zussman, Wilmington, Del.

[73] Assignee: E. I. Du Pont de Nemours and Company, Wilmington, Del.

[21] Appl. No.: 41,417

[22] Filed: Mar. 31, 1993

[51] Int. Cl.$^5$ ............................................. B33B 17/00
[52] U.S. Cl. .................................. 428/285; 428/901; 428/286; 428/287; 428/290; 361/750
[58] Field of Search ............... 428/209, 210, 475.8, 428/461, 457, 285, 288, 458, 901, 323, 338, 286, 287, 290; 361/748, 749, 750

[56] References Cited

U.S. PATENT DOCUMENTS

| | | | |
|---|---|---|---|
| 4,729,921 | 3/1988 | Tokarsky | 428/288 |
| 4,751,146 | 6/1988 | Maeda et al. | 428/475.8 |
| 5,049,435 | 12/1991 | Uno et al. | 428/209 |

Primary Examiner—Patrick J. Ryan
Assistant Examiner—Patrick Jewik

[57] ABSTRACT

Dimensionally stable resin impregnated laminates for printed wiring board applications are reinforced with from 43 to 57 weight percent of nonwoven aramid sheet having a coefficient of thermal expansion of less than 10 ppm per ° C, a basis weight of from 0.8 to 4.0 oz/yd$^2$, a density of from 0.5 to 1.0 g/cc and a Gurley Hill Porosity of less than 10 sec.

4 Claims, No Drawings

RESIN IMPREGNATED LAMINATE FOR WIRING BOARD APPLICATIONS

BACKGROUND OF THE INVENTION

To provide consumers with increasing functionality at lowest possible cost the electronics industry is driving towards products which are smarter, faster and smaller. This evolution is being promoted by advances in semiconductor materials and fabrication technology, such as multilayer IC (integrated circuits), submicron IC features and large scale integration. Packaging and interconnect technologies play a key supporting role in the evolution. Materials for packaging and interconnect technologies must support high yield fabrication, high density packaging, fast signal propagation and compatibility with surface mount and direct attach of components. To meet these requirements reinforcements with lower in-plane CTE (coefficient of expansion), greater dimensional stability, lower dielectric constant and smooth surfaces are needed.

CTE is an important property for the printed wiring board (PWB) substrate especially in the surface mount and direct attach chip applications. CTE mismatch between the chip (or chip carrier) and the board pose reliability problems due to potential solder joint cracking during thermal cycling. Various techniques were developed to insure some reliability of the solder joints, e.g., "J" leads, gull wing leads, leaded chip carriers and leadless chip carriers. However, the high (13–18 ppm/° C) in-plane CTE of the standard epoxy/E-glass or polyimide/E-glass still resulted in some solder joint failures. In order for components to successfully survive environmental testing, in-plane CTE's of 8–10 ppm/° C are necessary.

The successful production of multilayer PWBs also requires layer-to-layer pad registration and registration of through holes to pads. During fabrication of PWBs, laminate materials experience a number of thermal excursions, including bake cycles at 120°–150° C. and short exposures to temperatures as high as 280° C. In general, these thermal exposures cause dimensional change in the laminate materials.

Normally, and especially in the case of p-aramid fibers, the fiber CTE is much lower than the resin CTE. It is possible to make low CTE laminates using very low resin contents (<40 wt. %), where the fiber properties dominate the composite properties. However, this laminate would have low peel strength, voids, etc. and would not meet all the property requirements for a reliable PWB, and is not a practical route to make PWBs.

SUMMARY OF THE INVENTION

The present invention provides a nonwoven aramid sheet useful as reinforcement in printed wiring board laminates having a coefficient of thermal expansion of less than 10 ppm per ° C, said sheet comprised of from 5 to 25 weight percent poly(m-phenyleneisophthalamide) fibrids and 75 to 95 weight percent p-aramid floc and having a basis weight of between 0.8 to 4.0 oz/yd$^2$, a density between 0.5 and 1.0 g/cc and a Gurley Hill Porosity of less than 10 sec.

Also provided is a thermoset resin laminate of high dimensional stability suitable for printed wiring board substrate consisting essentially of thermoset resin reinforced with from 43 to 57 weight percent of the nonwoven aramid sheet of this invention.

DETAILED DESCRIPTION OF THE INVENTION

The reinforcement of the laminates of this invention is a nonwoven aramid sheet having a coefficient of thermal expansion (CTE) of less than 10 ppm per ° C and is prepared from 75 to 95 wt. % p-aramid floc and from 5 to 25 wt. % poly(m-phenylene isophthalamide) fibrids. Floc is defined in U.S. Pat. No. 4,729,921. Para-aramid fibers are very high in strength and modulus. Examples of paraaramids are set out in U.S. Pat. No. 3,869,429 and in European Patent 330,163. Specific examples of paraaramids are poly(p-phenylene terephthalamide) (PPD-T) and copoly(p-phenylene-3,4'-oxydiphenylene terephthalamide). Fibers of PPD-T are generally made by an air gap spinning process such as described in U.S. Pat. No. 3,767,756; are preferably heat treated as described in U.S. Pat. No. 3,869,430. Preferably poly(p-phenylene terephthalamide) floc which has not been refined, i.e., as prepared, is employed. High shear forces exerted on the fibers during processing, e.g., refining, causes damage to the fibers and adversely affect the CTE of the reinforcement. It is also preferred to employ p-aramid floc of high orientation and relatively lower crystallinity. Fibrids are defined in U.S. Pat. No. 4,729,921.

To prepare the sheet, the floc and fibrids are dispersed in the desired proportions as an aqueous slurry, the solids concentration generally ranging between 0.005% and 0.02%. The slurry is not refined. The slurry can be made into paper by conventional means. In the examples which follow, wet sheets were formed in an inclined wire Deltaformer (papermaking machine) and dried using heated drier cans. The dried sheets preferably having a basis weight between 0.8 and 4.0 oz/yd$^2$, are then calendered between two hard-surface rolls. Calender pressures between about 500 and 2500 kg/cm (nip pressure) and roll temperatures between about 130° C. and 150° C. are commonly employed. The density of the paper reinforcement should be between 0.5 and 1.0 the paper should have a Gurley Hill Porosity of less than 10 sec.

The paper is then prepregged with a resin having a high Tg, e.g., above about 160° C. In the examples that follow, the papers were impregnated on a vertical prepegging tower using an epoxy resin system, Tg about 170° C.

The CTE of the reinforced composite is a function of the sheet as well as the resin. The CTE of the paramid fabric is normally much lower than that of the resin. However, the use of low resin content, while resulting in a low overall CTE, causes other problems. Since there is less resin to act as an adhesive between laminate layers, the peel strength is diminished. Low resin content will also lead to higher void content and greater likelihood of blister formation when the air entrapped in the voids expands upon heating of the PWB.

As mentioned previously it is important that the paper reinforcement have a density of between about 0.5 and 1.0, preferably 0.7 to 0.95 g/cc to provide dimensional stability during fabrication of printed wiring boards. Less resin is required to fully saturate a more dense paper, i.e., one that has fewer voids. This results in a better overall CTE since as mentioned previously the CTE of the resin is normally much greater than that of the floc.

The following examples are illustrative of the present invention.

EXAMPLES

An aqueous slurry comprised of about 79 to 89% by weight of floc (short fibers less than 0.5 in. long) of poly(p-phenylene terephthalamide) and 11 to 21% by weight of refined poly(m-phenylene isophthalamide) fibrids was prepared at a solids concentration of between 0.005 and 0.02%. Proportions of floc and fibrid are reported in Table 1. The slurry was formed into wet sheets as described above and dried. The dried sheets having a basis weight (B.W.) reported in the Table, were calendered at a pressure between 554 and 1676 kg/cm (nip pressure). The papers having a thickness after calendering as reported in Table 1 had a calculated density of between 0.53 and 0.87 g/cc as reported in Table 1.

The paper was prepregged as described above with epoxy resin, the resin content for each item being shown in Table 1. Laminates were prepared by pressing 14 to 16 layers of the prepregs sandwiched between 1 oz. copper foil on each side in a vacuum press using the following press (time/temp) cycle: 1 minute at 200° F., 8 psi; 40 minutes at 350° F., 600 psi; 30 minutes at 400° F., 200 psi; and 5 minutes at 100° F., 100 psi. Specimens were cut from the thick laminates and the copper was etched off. The CTE was measured in the MACHINE-"X", and CROSS-"Y", directions using a DuPont Termomechanical Analyzer and the results reported in Table 1.

TABLE 1

|  | Item 1 | Item 2 | Item 3 | Item 4 | Item 5 | Item 6 | Item 7 |
|---|---|---|---|---|---|---|---|
| Paper Composition | 83% floc 17% fibrid | 83% floc 17% fibrid | 83% floc 17% fibrid | 86% floc 14% fibrid | 88% floc 11% fibrid | 88% floc 12% fibrid | 89% floc 11% fibrid |
| Paper B.W. (oz/yd$^2$) | 1.69 | 1.66 | 1.66 | 2.07 | 1.67 | 1.60 | 1.61 |
| Paper Thickness (mils) | 2.6 | 3.3 | 2.6 | 3.3 | 4.2 | 3.3 | 2.5 |
| Gurley Hill Porosity (Sec) | 1.8 | 0.6 | 0.9 | 0.9 | 0.2 | 26.2 | 338.0 |
| Paper Density | 0.87 | 0.67 | 0.85 | 0.84 | 0.53 | 0.65 | 0.86 |
| Resin Conc. (%) | 47.8 | 52.9 | 50 | 52.4 | 49.1 | 53.3 | 48.2 |
| CTE |  |  |  |  |  |  |  |
| X direction | 6.6 | 6.7 | 7.6 | 8.8 | 6.9 | 9.0 | 13.8 |
| Y direction | 6.8 | 8.8 | 10.6 | 9.1 | 8.3 | 18.3 | 16.6 |
| X-Y Average | 6.7 | 7.75 | 9.1 | 8.95 | 7.6 | 13.65 | 15.2 |

We claim:

1. Nonwoven aramid sheet useful as reinforcement in electronic printed wiring board laminates having a coefficient of thermal expansion of less than 10 ppm per ° C, said sheet comprised of from 5 to 25 weight percent poly(m-phenylene isophthalamide) fibrids and 75 to 95 weight percent p-aramid floc and having a basis weight of between 0.8 and 4.0 oz/yd$^2$ and a density between 0.5 and 1.0 g/cc and a Gurley Hill Porosity of less than 10 seconds.

2. A nonwoven aramid sheet according to claim 1 having a density between 0.7 and 0.95 g/cc.

3. A nonwoven aramid sheet according to claim 1 wherein the p-aramid floc is poly(p-phenylene terephthalamide).

4. A thermoset resin laminate suitable for printed wiring board substrate consisting essentially of thermoset resin reinforced with from 43 to 57 weight percent of the nonwoven aramid sheet of claim 1 or 2.

* * * * *

UNITED STATES PATENT AND TRADEMARK OFFICE
CERTIFICATE OF CORRECTION

PATENT NO. : 5,314,742
DATED      : May 24, 1994
INVENTOR(S): Birol Kirayoglu et al.

It is certified that error appears in the above-identified patent and that said Letters Patent is hereby corrected as shown below:

On the title page, item (75), inventors: "William J. Sillivan" should read --William J. Sullivan--.

Signed and Sealed this

Twentieth Day of September, 1994

Attest:

BRUCE LEHMAN

Attesting Officer

Commissioner of Patents and Trademarks